(12) United States Patent
Hsu

(10) Patent No.: US 7,521,406 B2
(45) Date of Patent: Apr. 21, 2009

(54) MICROELECTRONIC CLEANING COMPOSITION CONTAINING HALOGEN OXYGEN ACIDS, SALTS AND DERIVATIVES THEREOF

(75) Inventor: Chien-Pin Sherman Hsu, Basking Ridge, NJ (US)

(73) Assignee: Mallinckrodt Baker, Inc, Phillipsburg, NJ (US)

( * ) Notice: Subject to any disclaimer, the term of this patent is extended or adjusted under 35 U.S.C. 154(b) by 778 days.

(21) Appl. No.: 10/982,330

(22) Filed: Nov. 5, 2004

(65) Prior Publication Data

US 2005/0176603 A1 Aug. 11, 2005

(51) Int. Cl.
*B08B 3/14* (2006.01)

(52) U.S. Cl. ...................... 510/175; 134/1.3

(58) Field of Classification Search .............. 510/175; 134/1.3
See application file for complete search history.

(56) References Cited

U.S. PATENT DOCUMENTS

| | | | | |
|---|---|---|---|---|
| 2,256,958 | A | 9/1941 | Muskat | 260/570.9 |
| 3,962,108 | A | 6/1976 | Perruccio | 252/142 |
| 4,642,221 | A | 2/1987 | Hansen et al. | 422/16 |
| 5,380,458 | A | 1/1995 | Douglass | 252/186.36 |
| 5,773,627 | A * | 6/1998 | Anderson et al. | 548/257 |
| 5,968,280 | A | 10/1999 | Ronay | 134/2 |
| 5,972,862 | A | 10/1999 | Torii et al. | 510/175 |
| 6,116,254 | A | 9/2000 | Shiramizu | 134/99.9 |
| 6,323,169 | B1 | 11/2001 | Abe | 510/176 |
| 6,447,563 | B1 * | 9/2002 | Mahulikar | 51/309 |
| 2005/0176602 | A1 | 8/2005 | Hsu | 510/175 |

FOREIGN PATENT DOCUMENTS

| | | |
|---|---|---|
| EP | 0 119 560 A2 | 9/1984 |
| JP | 8 274057 | 10/1996 |
| JP | 9 279189 | 10/1997 |
| JP | 2000-056478 | 2/2000 |
| JP | 2003 119494 | 4/2003 |
| JP | 2004 004775 | 8/2004 |
| JP | 2005 227749 | 8/2005 |
| WO | WO 03/006599 | 1/2003 |

* cited by examiner

*Primary Examiner*—Gregory E Webb
(74) *Attorney, Agent, or Firm*—George W. Rauchfuss, Jr.; Ohlandt, Greeley, Ruggiero & Perle

(57) ABSTRACT

Microelectronic cleaning compositions for cleaning microelectronic substrates, and particularly cleaning compositions useful with and having improved compatibility with microelectronic substrates characterized by silicon dioxide, sensitive low-κ or high-κ dielectrics and copper, tungsten, tantalum, nickel, gold, cobalt, palladium, platinum, chromium, ruthenium, rhodium, iridium, hafnium, titanium, molybdenum, tin and other metallization, as well as substrates of Al or Al(Cu) metallizations and advanced interconnect technologies, are provided by microelectronic cleaning compositions comprising halogen acids, salts and derivatives thereof.

55 Claims, No Drawings

ND OXYGEN ACIDS, SALTS AND DERIVATIVES
MICROELECTRONIC CLEANING COMPOSITION CONTAINING HALOGEN OXYGEN ACIDS, SALTS AND DERIVATIVES THEREOF

FIELD OF THE INVENTION

This invention relates to methods and cleaning compositions for cleaning microelectronic substrates, and particularly to such cleaning compositions useful with and having improved compatibility with microelectronic substrates characterized by silicon dioxide, sensitive low-κ or high-κ dielectrics and copper, tungsten, tantalum, nickel, gold, cobalt, palladium, platinum, chromium, ruthenium, rhodium, iridium, hafnium, titanium, molybdenum, tin and other metallization, as well as substrates of Al or Al(Cu) metallizations and advanced interconnect technologies. The invention also relates to the use of such cleaning compositions for stripping photoresists, and cleaning residues from plasma process generated organic, organometallic and inorganic compounds, and cleaning residues from planarization processes such as chemical mechanical polishing (CMP).

BACKGROUND TO THE INVENTION

Many photoresist strippers and residue removers have been proposed for use in the microelectronics field as downstream or back end of the manufacturing line cleaners. In the manufacturing process a thin film of photoresist is deposited on a wafer substrate, and then circuit design is imaged on the thin film. Following baking, the unpolymerized resist is removed with a photoresist developer. The resulting image is then transferred to the underlying material, which is generally a dielectric or metal, by way of reactive plasma etch gases or chemical etchant solutions. The etchant gases or chemical etchant solutions selectively attack the photoresist-unprotected area of the substrate. As a result of the plasma etching process, photoresist, etching gas and etched material by-products are deposited as residues around or on the sidewall of the etched openings on the substrate.

Additionally, following the termination of the etching step, the resist mask must be removed from the protected area of the wafer so that the final finishing operation can take place. This can be accomplished in a plasma ashing step by the use of suitable plasma ashing gases or wet chemical strippers. Finding a suitable cleaning composition for removal of this resist mask material without adversely affecting, e.g., corroding, dissolving or dulling, the metal circuitry has also proven problematic.

As microelectronic fabrication integration levels have increased and patterned microelectronic device dimensions have decreased, it has become increasingly common in the art to employ copper metallizations, low-κ and high-κ dielectrics. These materials have presented additional challenges to find acceptable cleaner compositions. Many process technology compositions that have been previously developed for "traditional" or "conventional" semiconductor devices containing Al/SiO$_2$ or Al(Cu)/SiO$_2$ structures cannot be employed with copper, tungsten, tantalum, nickel, gold, cobalt, palladium, platinum, chromium, ruthenium, rhodium, iridium, hafnium, titanium, molybdenum, tin and other metallized, and low-κ or high-κ dielectric structures. For example, hydroxylamine based stripper or residue remover compositions are successfully used for cleaning devices with Al metallizations, but are practically unsuitable for those with copper and other metallizations. Similarly, many copper metallized/low-κ strippers are not suitable for Al metallized devices unless significant adjustments in the compositions are made.

Removal of these etch and/or ash residues following the plasma etch and/or ashing process has proved problematic. Failure to completely remove or neutralize these residues can result in the absorption of moisture and the formation of undesirable materials that can cause corrosion to the metal structures. The circuitry materials are corroded by the undesirable materials and produce discontinuances in the circuitry wiring and undesirable increases in electrical resistance.

The current back end cleaners show a wide range of compatibility with certain, sensitive dielectrics and metallizations, ranging from totally unacceptable to marginally satisfactory. Many of the current strippers or residue cleaners are not acceptable for advanced interconnect materials such as porous and IOW-κ dielectrics and copper metallizations. Additionally, the typical alkaline cleaning solutions employed are overly aggressive towards porous and low-κ and high-κ dielectrics and/or copper metallizations. Moreover, many of these alkaline cleaning compositions contain organic solvents that show poor product stability, especially at higher pH ranges and at higher process temperatures.

Heretofore, oxidizers have been used in cleaning compositions in primarily aqueous form. Oxidizers, such as the commonly used hydrogen peroxide and peracids, are known to react readily or decompose easily, especially in organic solvent matrices that have been generally employed in stripping compositions. In such instances the oxidizing agent is consumed and becomes unavailable for its intended use. Additionally, microelectronic cleaning compositions containing oxidizers often show poor product stability, especially in the presence of significant amounts of 10 wt % or more of organic solvents, and at higher pH ranges and high process temperatures. Furthermore, in many compositions the use of stabilizers and solvents often tie up the oxidizing agent resulting in diminished capabilities of performing effective oxidation/reduction reactions employed in the cleaning process. In U.S. Pat. No. 6,116,254 the inventors teach introducing chlorine gas into pure water in a tank to thereby generate chloride ions, hypochlorite ions, chlorite ions and chlorate ions in the pure water and, then immersing a substrate in the pure water solution for cleaning. Such a cleaning scheme is not well controlled or stable over a period of days and is certainly not environmentally friendly and has toxic properties. Additionally, the amount of dissolved chlorine is limited to no more than 0.3% due to the limitation of the amount of chlorine gas dissolvable in the water. Furthermore, the pure water solutions with dissolved chlorine gas is always an acidic mixture and, thus, not usable in situations where an alkaline cleaning solution is desired or required. Moreover, such a cleaning solution is not a preformed product capable of being packaged and transported for use at a site remote from its production. Also, the patentees state that it is sometimes necessary to screen the irradiation of visible and/or UV light to the pure water solution containing the dissolved chlorine gas in order to prevent decomposition from occurring. The pure water solution containing the dissolved chlorine gas is also temperature sensitive and is generally kept at a temperature of 10° C. while being generated and until ready for use. All of the drawbacks make this cleaning system not very desirable and severely limits its use.

BRIEF SUMMARY OF THE INVENTION

There is, therefore, a need for microelectronic cleaning compositions that are suitable for back end cleaning operations, which compositions are effective cleaners and are applicable for stripping photoresists and cleaning residues from plasma process generated organic, organometallic and inorganic compounds, cleaning residues from planarization processes, such as CMP, and which can be used for advanced interconnect materials employing copper and other metallizations, including but not limited to tungsten, tantalum, nickel, gold, cobalt, palladium, platinum, chromium, ruthenium, rhodium, iridium, hafnium, titanium, molybdenum, and tin metallization, and porous or non-porous low-κ (i.e., a κ value of 3 or less) or high-κ (i.e., a κ value of 20 or greater) dielectrics as well as useful for cleaning conventional devices, such as those with aluminum or aluminum(copper) metallizations containing silicon dioxide, low-κ or high-κ dielectrics. There is also a need for such cleaning compositions that avoid pitfalls and drawbacks of the cleaning system disclosed in U.S. Pat. No. 6,116,254 as mentioned hereinbefore. This invention also relates to such compositions that are generally effective cleaners for cleaning all such devices over a wide range of pH conditions.

It has been discovered that effective microelectronic cleaning compositions for cleaning microelectronic substrates, and particularly cleaning compositions useful with and having improved compatibility with microelectronic substrates characterized by silicon dioxide, sensitive low-κ or high-κ dielectrics and copper, tungsten, tantalum, nickel, gold, cobalt, palladium, platinum, chromium, ruthenium, rhodium, iridium, hafnium, titanium, molybdenum, tin and other metallization, as well as substrates of Al or Al(Cu) metallizations and advanced interconnect technologies, are provided by microelectronic cleaning compositions comprising an oxidizer selected from halogen oxygen acids, salts of said acids, and derivatives thereof wherein the derivatives are selected from halogenated isocyanates, chlorine dioxide, chlorine monoxide, and hypochlorite-phosphite complexes, with the proviso that when the oxidizer is hypochlorous acid the cleaning composition also must contain a non-ammonium-producing alkaline base. These cleaning compositions provide improved and superior cleaning and residue removal with surprisingly good compatibilities with many sensitive substrates. Such microelectronic cleaning compositions that comprise metal-free halogen oxygen acids and salts thereof have shown particular advantageous capabilities for microelectronic cleaning applications.

The microelectronic cleaning compositions of this invention can be formulated as highly aqueous to semi-aqueous to non-aqueous (organic), i.e., non-reactive organic solvent which is inclusive of minimally non-reactive organic solvent based, compositions, with the proviso that when the organic salt of the halogen oxygen acid is an alkyl hypochlorite, the solvent is not an amide, sulfone, sulfolene, selenone or a saturated alcohol solvent. The cleaning compositions of this invention are suitable for stripping photoresists and cleaning residues from plasma process generated organic, organometallic and inorganic compounds, and have improved compatibility with microelectronic substrates characterized by silicon dioxide, sensitive low-κ or high-κ dielectrics and copper, tungsten, tantalum, nickel, gold, cobalt, palladium, platinum, chromium, ruthenium, rhodium, iridium, hafnium, titanium, molybdenum, tin and other metallization, as well as substrates of Al or Al(Cu) metallizations, and advanced interconnect technologies. Additionally, the cleaning compositions of this invention are particularly suitable for cleaning difficult samples containing very stubborn plasma etch and ash residues and also hardened (e.g., polymerized) photoresists that are generated in the manufacturing process for producing CU/low-κ and high-κ dielectrics structures, whereas other highly aggressive reagents such as HF, hydroxylamine and strong alkaline solutions often fail to provide the necessary or required cleaning and to do so with acceptable substrate compatibility. The cleaning compositions of this invention may be used alone or coupled with other cleaning solutions. Additionally, the cleaning compositions of this invention may optionally contain other components employable in microelectronic cleaning compositions, including but not limited to, alkaline bases, non-ammonium bases, acids, organic and inorganic metal chelating or complexing agents, cleaning performance enhancing additives including metal ion-free silicates, metal corrosion inhibitors, fluorides, and surfactants.

A further feature of this invention comprise the discovery that the halogen oxygen acids, salt and derivatives thereof useful in this invention are stabilized, as to their available halogen, by the use therewith of a stabilizer component that is a triazole, thiazole, tetrazole or imidazole. This stabilization feature is particularly applicable to microelectronic cleaning compositions of this invention containing an oxidizer selected from halogen oxygen acids, organic salts of halogen oxygen acids, particularly organic salts of hypochlorous acid, and especially alkyl hypochlorites and tetraalkylammonium hypochlorites.

DETAILED DESCRIPTION OF THE INVENTION AND PREFERRED EMBODIMENTS

The novel back end microelectronic cleaning composition of this invention will comprise an oxidizer selected from one or more of halogen oxygen acid, inorganic and organic salts and derivatives thereof wherein the derivatives are selected from halogenated isocyanates, chlorine dioxide, chlorine monoxide, and hypochlorite-phosphite complexes with the proviso that when the oxidizer is hypochlorous acid the cleaning composition also must contain a non-ammonium-producing alkaline base. The halogen oxygen acids, salts of said acids, and derivatives thereof include such compounds wherein the halogen may be chlorine, fluorine, bromine and iodine, but are especially chlorine, bromine, and fluorine, and more especially chlorine. The halogen oxygen acids, salts and derivatives thereof will generally be present in the composition in an amount, based on the total weight of the composition, of from about 0.001% to about 30%, preferably in an amount of from about 0.001% to about 15%, and preferably in an amount of from about 0.001% to about 8% by weight. The compositions will be such as to generally provide from about 0.001% to about 30% available halogen, preferably from about 0.001% to about 15%, and more preferably from about 0.001% to about 8% available halogen in the compositions, wherein the available halogen is determined iodometric titration.

The halogen oxygen acids include, but are not limited to, hypohalous acids, halous acids, halic acids, perhalic acids, and halogen-containing oxyacids of the group VIA elements S, Se and Te. Examples of especially useful halogen oxygen acids include chlorous acid, hypochlorous acid, hypobromous acid, chloric acid, perchloric acid, and monobasic fluorine containing oxy acids, such as $HOSO_2F$, $HOSO_2CF_3$, $HOSF_5$, $HOSeF_5$ and $HOTeF_5$.

Any suitable inorganic salt of the halogen oxygen acids may be employed in the compositions of this invention. The inorganic and organic salts of the halogen oxygen acids include, but are not limited to, organic and inorganic hypohalites such as hypochlorites and hypobromites, chlorates, chlorites and perchlorates. The inorganic salts are preferably alkali and alkaline earth metal salts, especially Na, K, Li, Ca, Sr, and Ba salts, and especially such chlorite and hypochlorite salts, most especially such hypochlorite salts, and in particular sodium and calcium hypochlorite. Especially useful are sodium hypochlorite, calcium hypochlorite and sodium chlorite.

Any suitable organic salt of the halogen oxygen acids may be employed in the compositions of this invention. Such organic salts include, but are not limited to alkyl chlorites and alkyl hypochlorites, tetraalkylammonium chlorites and tetraalkylammonium hypochlorites, substituted trialkylammonium chlorites and substituted trialkylammonium hypochlorites, tetraalkyl phosphonium chlorites and tetraalkyl phosphonium hypochlorites, and benzoxonium chlorites and benzoxonium hypochlorites. Examples of such preferred metal-free containing salts include methyl, ethyl, propyl, t-butyl, tetramethylammonium, tetraethyl ammonium, tetrapropylammonium, tetrabutylammonium, dimethyldiethylammonium, (2-hydroxyethyl)trimethylammonium, glycidyl trimethylammonium, chlorohydroxypropyl triethylammonium, benzyltrimethylammonium, tetrabutylphosphonium and benzoxonium salts. Especially preferred metal-free salts are t-butyl hypochlorite and tetramethylammonium hypochlorite.

The derivates of the halogen oxygen acids that may be employed in the microelectronic cleaning compositions of this invention include halogenated isocyanates, particularly chlorinated isocyanates, chlorine dioxide, dichlorine monoxide, and hypochlorite-phosphite complexes.

Especially preferred for use in the microelectronic cleaning compositions of this invention are sodium hypochlorite, calcium hypochlorite, alkyl hypochlorites such as t-butyl hypochlorite, and tetraalkylammonium hypochlorites such as tetramethylammonium hypochlorite. In one embodiment of the invention the microelectronic cleaning compositions of this invention will contain a stabilizing agent to maintain the level of available halogen in the compositions. Such stabilizing agent may be any suitable triazole, thiazole, tetrazole and imidazole. Such stabilizers include, but are not limited to, benzotriazole, 1-hydroxybenzotriazole, 5-chlorobenzotriazole, 5-methyl-1(H)-benzotriazole, benzotriazole-5-carboxylic acid, 5-nitrobenzotriazole, imidazole, benzimidazole, 2-mercaptobenzothiazole, 2-mercaptobenzimidazole, 1-phenyl-1H-tetrazole-5-thiol, and 5-phenyl-1H-tetrazole, The preferred stabilizer is benzotriazole. The amount of such stabilizer employed in the invention may be any suitable amount, but will generally be, based on the total weight of the composition, about 0.5% by weight or less, generally about 0.2% or less, and preferably from about 0.01% to about 0.2% by weight. The stabilizer may be added to the composition along with the halogen oxygen acid, salt or derivative thereof, or may, and in most cases preferably, is added to the reaction mixture in which the halogen oxygen acid, salt or derivative thereof is produced. Especially for metal-free organic salts such as t-butyl hypochlorite or tetramethylammonium hypochlorite, the stabilizer, especially benzotriazole, is employed in the reaction mixture in which the product is produced so that the level of available halogen from the product is maintained, or at least its lessening is substantially abated or inhibited.

The microelectronic cleaning compositions of this invention may be and preferably are formulated as aqueous compositions, but may be formulated as semi-aqueous and non-reactive (inclusive of minimally non-reactive) organic solvent based compositions. Generally, the preferred solvent is water. The water can be present as part of the aqueous portion of the other components and/or as additional added water. However, the compositions of this invention may also be formulated with non-reactive organic solvents, which are chosen based on the particular halogen oxygen acid, salt or derivative thereof employed. Examples of such suitable non-reactive organic solvents include, but are not limited to, sulfolane (tetrahydrothiopene-1,1-dioxide), 3-methylsulfolane, n-propyl sulfone, n-butyl sulfone, sulfolene (2,5-dihydrothiopene-1,1-dioxide), 3-methylsulfolene, amides such as 1-(2-hydroxyethyl)-2-pyrrolidinone (HEP), dimethylpiperidone (DMPD), N-methyl pyrrolidinone (NMP), and dimethylacetamide (DMAc), dimethylformamide (DMF), and saturated alcohols such as methanol, ethanol, propanol, butanol, hexanol, ethylene glycol, propylene glycol, glycerol, and hexafluoroisopropanol, alkyl nitrites such as acetonitrile, halogenated alkanes ($C_nH_{2n+2-z}Y_z$), where Y is a halogen and n is an integer of from 1 to 6, such as for example, $CCl_4$, $C_2Cl_6$ and $C_2F_6$. The organic salts of the halogen oxygen acids are those that are generally formulated in the non-reactive organic solvent-based formulations. However, when the organic salt is an alkyl hypochlorite, the non-reactive organic solvent is not an amide, sulfone, sulfolene, selenone or a saturated alcohol solvent. The amount of solvent in the compositions of this invention, whether the solvent is water, water and non-reactive organic solvent, or non-reactive organic solvent, will generally be employed in the composition in an amount, based on the total weight of the composition, of from about 70% to about 99.999% by weight.

The microelectronic cleaning compositions of this invention may optionally contain other components found in microelectronic cleaning compositions. Such other optional components include, but are not limited to, alkaline bases and particularly non-ammonium bases, acids, organic and inorganic metal chelating or complexing agents, cleaning performance enhancing additives including metal ion-free silicates, metal corrosion inhibitors, fluorides, and surfactants.

The alkaline base is a non ammonium-producing base and can be present in an amount, based on the total weight of the composition, of from 0% to about 30%, generally in an amount of from 0.1% to about 30%, preferably in an amount of from about 0.1% to about 10%, most preferably in an amount of from about 0.1% to about 5%. Any suitable alkaline base may be employed in the cleaning compositions. As examples of suitable non-ammonia derived bases there may be mentioned tetraalkylammonium hydroxides such as those of the formula $R_4N^+OH^-$ where each R is independently a substituted or unsubstituted alkyl groups, preferably of 1 to 22 carbon atoms and more preferably 1 to 4 carbon atoms. Among the non-ammonia derived alkaline bases useful in the compositions there may be mentioned, for example, tetramethylammonium hydroxide, tertrabutylammonium hydroxide, choline hydroxide, benzyltrimethylammonium hydroxide, a tetraalkylphosphonium such as tetrabutylphosphonium hydroxide, benzoxonium hydroxide and the like. Inorganic bases such as for example potassium hydroxide, sodium hydroxide and the like may also be used as the alkaline base.

The compositions of this invention may also optionally contain any suitable inorganic or organic acid. It is generally preferred to employ an inorganic acid if an acid is employed. The acids can be employed to generate lower pH compositions when that is desirable, and can be employed to couple with halogen oxygen acids. Examples of suitable acids include, but are not limited to, hydrochloric acid, hydrofluoric acid, sulfuric acid, phosphoric acid and acetic acid. The acids may be present in the compositions of this invention in an amount, based on the total weight of the composition, of from 0% to about 30%, generally in an amount of from about 0.01% to about 10%, preferably in an amount of from about 0.01% to about 5%.

Organic or inorganic chelating or metal complexing agents are not required, but offer substantial benefits, such as for example, improved product stability. Examples of suitable chelating or complexing agents include but are not limited to trans-1,2-cyclohexanediamine tetraacetic acid (CyDTA), ethylenediamine tetraacetic acid (EDTA), stannates, pyrophosphates, alkylidene-diphosphonic acid derivatives (e.g. ethane-1-hydroxy-1,1-diphosphonate), phosphonates containing ethylenediamine, diethylenetriamine or triethylenetetramine functional moieties [e.g. ethylenediamine tetra(methylene phosphonic acid) (EDTMP), diethylenetriamine penta(methylene phosphonic acid), triethylenetetramine hexa(methylene phosphonic acid). The optional chelating agent will be present in the composition in an amount, based on the total weight of the composition, of from 0% to about 10%, preferably from about 0.1% to about 2%.

The cleaning compositions of this invention may also optionally include cleaning performance enhancing additives for the compositions of this invention, such as catechol, pyrogallol, gallic acid, resorcinol and the like, and particularly metal ion-free silicate stabilizers. Any suitable metal ion-free silicate may be used in the compositions of the present invention. The silicates are preferably quaternary ammonium silicates, such as tetraalkyl ammonium silicate (including hydroxy- and alkoxy-containing alkyl groups generally of from 1 to 4 carbon atoms in the alkyl or alkoxy group). The most preferable metal ion-free silicate components are tetramethylammonium silicate, tetraethylorthosilicate, and tetrakis(2-hydroxyethyl) orthosilicate. The cleaning performance enhancing additives may be present in the composition in an amount, based on the total weight of the composition, of from about 0% to 30%, preferably in an amount of from about 0.1% to about 5%.

The compositions of this invention may also optionally contain metal corrosion inhibitors such as the triazole, thiazole, tetrazole and imidazole stabilizers. The metal corrosion inhibitor will be employed in an amount, based on the total weight of the composition, of from 0% to about 30%, generally in an amount of from about 0.1% to about 5%, and preferably about 0.1% to about 3%.

The cleaning compositions optionally may also contain suitable surfactants. Examples of suitable surfactants include, but are not limited to, dimethyl hexynol (Surfynol-61), ethoxylated tetramethyl decynediol (Surfynol-465), polytetrafluoroethylene cetoxypropylbetaine (Zonyl FSK), Zonyl FSH and the like. The surfactant will generally be present in an amount, based on the total weight of the composition, of from 0% to about 5%, preferably 0.001% to about 5% and more preferably from about 0.001% to about 0.3%.

The cleaning compositions may also optionally contain suitable non ammonium-producing fluoride. Examples of such suitable fluoride compounds include, but are not limited to, tetramethylammonium fluoride, and tetrabutylammonium fluoride. Other suitable fluorides include, for example fluoroborates, tetrabutylammonium fluoroborates, aluminum hexafluorides, antimony fluoride and the like. The fluoride components will be present in an amount, based on the total weight of the composition, of from 0% to 30%, preferably from about 0.01% to 30%, and more preferably from about 0.01% to about 10%.

The cleaning compositions of this invention can be used over a wide range of process/operating conditions of pH and temperature, and can be used to effectively remove photoresists, post plasma etch/ash residues, sacrificial light absorbing materials and anti-reflective coatings (ARC). Additionally, it has been discovered that very difficult to clean samples, such as highly crosslinked or hardened photoresists and structures which contain titanium (such as titanium, titanium oxide and titanium nitride) or tantalums (such as tantalum, tantalum oxide and tantalum nitride) can be readily cleaned with the cleaning compositions of this invention.

Examples of cleaning composition of this invention containing metal halogen oxygen acids salts thereof and derivatives are set forth in the following Tables 1 and 2. In the following Tables 1 and 2 the abbreviations employed are as follows.

NaOCl=5.25% NaOCl (aqueous)
NaOCl-Solution A=Aqueous NaOCl solution with 12.9% available chlorine
NaOCl-Solution B=Aqueous NaOCl solution with 12.3% available chlorine
$HClO_3$=Chloric acid
TMAH=25% Tetramethylammonium hydroxide (aqueous)
CyDTA=trans-1,2-cyclohexanediamine tetraacetic acid
EHDP=1-hydroxyethane-1,1-diphosphonic acid
EG=ethylene glycol
Water=additional water over water from aqueous solution of components
Zonyl FSH=Surfactant

TABLE 1

| Component | Compositions/Parts by Weight | | | | |
|---|---|---|---|---|---|
| | A | B | C | D | E |
| NaOCl | 100 | 40.6 | | | |
| NaOCl—Solution A | | | 60 | | 30 |
| NaOCl—Solution B | | | | | |
| $HClO_3$ | | | | 6.6 | |
| TMAH | | 2.7 | | 8.3 | |
| EG | | | | | |
| EDHP | | 0.6 | | | |
| CyDTA | | | 0.58 | | |
| Zonyl FSH | | | | | |
| Water | | | 8.8 | 39.7 | 30 |

TABLE 2

| Component | Compositions/Parts by Weight | | | |
|---|---|---|---|---|
| | F | G | H | I |
| NaOCl | | | | |
| NaOCl-Solution A | | 30 | 30 | |
| NaOCl-Solution B | | | | 150 |
| $HClO_3$ | 20 | | | |
| TMAH | | | | |
| EG | | | 3 | |
| EDHP | | | | |
| CyDTA | | | | |
| Zonyl FSH | | 0.06 | | 0.07 |
| Water | 40 | 30 | 147 | |

The cleaning capability of such microelectronic cleaning compositions of this invention is illustrated by the following tests in which a microelectronic structure that comprised a silicon wafer of the following structure, namely photoresist (PR)/carbon doped oxide (CDO)/Nitride/Copper vias was cleaned. In a first test, the microelectronic structure was first immersed in a 10:1 solution of commercially available CLk-888 cleaner/residue remover (Mallinckrodt Baker, Inc) and 30% hydrogen peroxide at 75° C. for 30 minutes and then immersed, in a second step, in Composition A of Table 1 and then the structure was water washed. Composition A removed 97% to 99% of all PR (bulk PR and tough "skin") and stubborn via. residues. Composition A also exhibited excellent substrate compatibility since there was no CDO etch. Similarly, in a second test employing Compositions G from Table 2, a first microelectronic structure that comprised a silicon wafer of the following structure, PR/CDO via, was immersed in Composition G of Table 2 for 30 minutes at 40° C. and then water rinsed, and a second microelectronic structure of the same composition was immersed in Composition I of Table 2 for 30 minutes at 40° C. and then water rinsed. Compositions G and I both removed 97% to 99% of all PR (bulk PR and tough "skin") and 100% stubborn via residues. Compositions G and I also exhibited excellent substrate compatibility since there was no CDO etch.

Examples of cleaning composition of this invention containing metal-free halogen oxygen acids salts thereof and derivatives are set forth in the following wherein:

TMAOCl-Solution A=Tetramethylammoniun hypochlorite (without benzotriazole stabilizer) as prepared in Preparation A following, and TMAOCl-Solution B=Tetramethylammoniun hypochlorite (with about 0.1% benzotriazole stabilizer) as prepared in Preparation B following.

Solution 81=Tetramethylammonium hypochlorite solution with 7.8% available chlorine (with about 0.1% benzotriazole stabilizer)

TMAF=20% Tetramethylammonium fluoride (aqueous)

TMACl=Tetramethylammonium chloride

Sulfolane=Tetrahydrothiopene-1,1-dioxide

Preparation A

To a 250-ml Erlenmeyer flask was added 152.8 g of 25% TMAH (tetramethylammonium hydroxide). Chlorine gas was introduced in a slow bubbling rate for approximately 6 minutes to give a yellow solution (with a weight gain of 18.25 g). To this resulting yellow solution was added additional 33.8 g of 25% TMAH to give an intermediate solution. After removing 3.5 g for pH measurements, additional 3.1 g of 25% TMAH was added to the remaining solution to give a yellow solution of TMAOCl (tetramethylammonium hypochlorite) mixture. This mixture was calculated to contain the following components: 15.2% (wt) TMAOCl, 13.2% TMACl, 0.9% TMAH, and 70.8% water. The available chlorine was calculated to be about 8.6%. A cleaning formulation of this invention was prepared by mixing 160 g of this mixture, 160 g water and 0.155 g Zonyl FSH surfactant. Thus this formulation was calculated to contain the following: 7.6% (wt) TMAOCl, 6.6% TMACl, 0.43% TMAH, 85.3% water, and 0.05% of Zonyl FSH. The available chlorine was calculated to be about 4.3%. This formulation was designated TMAOCl-Solution A.

Preparation B

To a 250-ml Erlenmeyer flask was charged 113.4 g of 25% TMAH and 0.13 g benzotriazole. Chlorine gas (10.2 g) was introduced in a slow bubbling rate for 11 minutes to give a clear, yellow solution (calculated 92.2% TMAH reacted). The resulting TMAOCl solution gave the following assay of available chlorine: 8.1% (initial, <2 hours after synthesis; 8.1% (1 day old standing at room temperature); 8.1% (6 days old); 8.0% (14 days old); and 7.5% (70 days old). A cleaning composition of this invention was prepared from this reaction product by adding sufficient water, 25% tetramethylammonium hydroxide (TMAH) and Zonyl FSH surfactant to give a final formulation solution with 3.5% available chlorine and 0.5% TMAH, 0.025% Zonyl FSH and 0.1% benzotriazole. The pH of a 10% aqueous solution was about pH 13 at 25° C. This formulation was designated TMAOCl-Solution B. The stabilizing effect of benzotriazole in maintaining the level of available chlorine is illustrated by this Preparation B.

In addition to said TMOACl-Solution A and TMOACl-Solution B compositions further examples of compositions of metal-free halogen oxygen acid salts include, but are not limited to, Compositions J, K, L and M in Table 3.

TABLE 3

| | Compositions/Parts by Weight | | | |
|---|---|---|---|---|
| Component | J | K | L | M |
| Solution 81 | 45 | 45 | 45 | 12.1 |
| Sulfolane | 55 | 45 | 45 | |
| TMAF | | | 10 | |
| Water | | 10 | | 86.3 |
| 1N HCl | | | | 1.6 |

The excellent cleaning performance and substrate compaibilities of such metal-free cleaning compositions of this invention are illustrated by the results of the following experiments. The copper, tantalum and tungsten etch rate for cleaning compositions of this invention are demonstrated by the etch rate data in the following Table 4. The etch rate was determined for Composition TMAOCl-Solution B utilizing the following test procedure. Pieces of copper, titanium and tungsten foil of approximately 13×50 mm were employed. The weight of the foil pieces was measured. After cleaning the foil pieces with 2-propanol, distilled water and acetone and the foil pieces are dried in a drying oven. The cleaned, dried foil pieces were then placed in loosely capped bottles of preheated TMAOCl-Solution B cleaning compositions of the invention and placed in a vacuum oven for a period of from two to twenty-four hours at the indicated temperature. Following treatment and removal from the oven and bottles, the cleaned foils were rinsed with copious amounts of distilled water and dried in a drying oven for about 1 hour and then permitted to cool to room temperature, and then the etch rate determined based on weight loss or weight change.

TABLE 4

| Composition | Cu Etch Rate at 45° C. (Å/min) | Ta Etch Rate at 45° C. (Å/min) | W Etch Rate at 45° C. (Å/min) |
|---|---|---|---|
| TMAOCl-Solution B | <1 | <1 | <1 |

The dielectric and barrier etch rates for the TMAOCl-Solution B Composition of this invention against various dielectrics and barriers were evaluated by the following test procedure. The film thickness of the wafer pieces is measured using a Rudolph Interferometer and/or ellipsometer. The wafer pieces (with dielectric or barrier material deposited on silicon wafers) were immersed in the designated cleaning compositions at 45° C. for 30 minutes, followed by rinsing with de-ionized water and drying under nitrogen flow/stream. The thickness was then measured again following the treatment and the etch rates were then calculated based on the change in film thickness, which are produced by the indicated treatments. The dielectric or barrier etch rates with the TMAOCl-Solution B Composition were as set forth in Table 5.

TABLE 5

| Dielectric/Barrier | Etch Rate @ 45° C. (Å/min) |
|---|---|
| Carbon doped oxide (CDO) | <1 |
| Coral (carbon doped oxide) | 1 |
| Black Diamond (carbon doped oxide) | 5 |
| Fluorinated silicate glass (FSG) | <1 |
| Tetraethylorthosilicate (TEOS) | <1 |
| SiOC | <1 |
| SiC | <1 |
| Silicon nitride (SiN) | <1 |

The cleaning performance of the metal-free halogen oxygen acid salt containing compositions, TMAOCl-Solution A and TMAOCl-Solution B, is illustrated by the cleaning results set forth in Table 6 in which the cleaning compositions of this invention were employed to clean silicon wafers of various microelectronic structure as detailed in the Table.

TABLE 6

| Microelectronic Structure | Composition and Process Conditions | Results |
|---|---|---|
| PR/CDO | TMAOCl-Solution A; 50° C. for 20 minutes | 100% clean (PR, shell, via residues) |
| PR/CDO | TMAOCl-Solution B; 50° C. for 20 minutes | 100% clean (PR, shell, via residues) |
| PR/SARC/CDO | Immersed first at 60° C. for 16 minutes in a solution of 8 parts of a solution of 150:60:17.5:1.8: 30 parts of sulfolane, water, 25% TMAH, EDTMP and EG, and 1 part 30% hydrogen peroxide; followed by: immersion in TMAOCl-Solution A for 15 minutes at 55° C. | 100% clean (PR, shell, via residues) |

SARC = Sacrificial anti-reflective coating
TMAH = Tetramethylammonium hydroxide
EDTMP = Ethylenediamine tetra(methylene phosphonic acid)
EG = Ethylene glycol While the invention has been described herein with reference to the specific embodiments thereof, it will be appreciated that changes, modification and variations can be made without departing from the spirit and scope of the inventive concept disclosed herein. Accordingly, it is intended to embrace all such changes, modification and variations that fall with the spirit and scope of the appended claims.

I claim:

1. A composition for cleaning photoresist or residue from a microelectronic substrate, the cleaning composition comprising:
(a) an oxidizer selected from the group consisting of an alkyl hypochlorite and a tetraalkylammonium hypochlorite, and
(b) a solvent for component (a),
(c) a stabilizer for available hydrogen from the oxidizer, the stabilizer being selected from the group consisting of triazoles, thiazoles, tetrazoles and imidazoles; and, optionally one or more of the following components:
(d) an non ammonium-producing alkaline base,
(e) an acid,
(f) a metal chelating or complexing agent,
(g) a cleaning performance enhancing additive,
(h) a metal corrosion inhibitor,
(i) a non ammonium-producing fluoride, and
(j) a surfactant;
with the proviso that when the oxidizer component (a) is an alkyl hypochlorite, the component (b) solvent is not an amide, sulfone, sulfolene, selenone or a saturated alcohol solvent.

2. A composition according to claim 1 wherein the oxidizer component (a) is tetramethylammonium hypochlorite.

3. A composition according to claim 2 wherein the component (b) solvent comprises water, and the composition also comprises a tetramethylammonium hydroxide as component (d).

4. A composition according to claim 3 additionally comprising a component (j) surfactant.

5. A composition according to claim 3 comprising benzotriazole as component (c).

6. A composition according to claim 2 wherein the component (b) solvent comprises sulfolane, and the composition also comprises tetramethylammonium fluoride as component (i).

7. A composition according to claim 6 wherein the composition comprises benzotriazole as component (c).

8. A composition according to claim 1 wherein the component (b) solvent comprises water, and the composition also comprises tetramethylammonium fluoride as component (i).

9. A composition according to claim 8 wherein the composition comprises benzotriazole as component (c).

10. A composition for cleaning photoresist or residue from a microelectronic substrate and stabilized as to the amount of available halogen, the cleaning composition comprising:
(a) an oxidizer selected from the group consisting of a halogen oxygen acid, a salt of said acid, or derivative thereof wherein the derivative is selected from the group consisting of halogenated isocyanates, chlorine dioxide, chlorine monoxide, and hypochlorite-phosphite complexes, and
(b) a solvent for component (a),
(c) a stabilizing effective amount of a stabilizer for available hydrogen from the oxidizer, the stabilizer being selected from the group consisting of triazoles, thiazoles, tetrazoles and imidazoles in an amount of from about 0.1% to about 5% by weight of the composition and having been incorporated with the oxidizer component during synthesis of the oxidizer;
and, optionally one or more of the following components:
(d) an non ammonium-producing alkaline base,
(e) an acid,
(f) a metal chelating or complexing agent,
(g) a cleaning performance enhancing additive,
(h) a metal corrosion inhibitor,
(i) a non ammonium-producing fluoride, and
(j) a surfactant;
with the provisos that when the oxidizer component (a) is an alkyl hypochlorite, the component (b) solvent is not an amide, sulfone, sulfolene, selenone or a saturated alcohol solvent, and when the oxidizer component (a) is hypochlorous acid the cleaning composition also must contain the non-ammonium-producing alkaline base.

11. A composition according to claim 10 wherein the composition comprises a halogen oxy acid or salt or derivative thereof in an amount, based on the total weight of the composition, of from about 0.001% to about 30% and provides from about 0.001% to about 30% available halogen.

12. A composition according to claim 10 the oxidizer is selected from the group consisting of a halogen oxy-acid, salt or derivative thereof wherein the derivative is a hypochlorite-phosphite complex and wherein the stabilizer (c) is present in an amount up to about 0.5% by weight.

13. A composition according to claim 10 wherein the stabilizer is benzotriazole.

14. A composition according to claim 10 wherein the oxidizer component (a) is selected from the group consisting of an alkyl chlorite, an alkyl hypochlorite, a tetraalkylammonium chlorite, a tetraalkylammonium hypochlorite, a substituted trialkylammonium chlorite and a substituted trialkylammonium hypochlorite, and wherein said oxidizer provides from about 0.001 to about 30% available halogen.

15. A composition according to claim 10 wherein the oxidizer component (a) is selected from the group consisting of hypochlorous acid, chloric acid, alkali and alkaline earth salts of said acids, alkyl hypochlorites and tetraalkylammonium hypochlorites.

16. A composition of claim 10 wherein the oxidizer component (a) is selected from the group consisting of sodium hypochlorite.

17. A composition according to claim 16 wherein the solvent is water.

18. A composition according to claim 10 wherein the oxidizer component (a) comprise $HClO_3$.

19. A composition according to claim 18 wherein the component (b) solvent comprises water, and the composition comprises a component (j) surfactant.

20. A process for cleaning photoresist or residue from a microelectronic substrate, the process comprising contacting the substrate with a cleaning composition for a time sufficient to clean the photoresist or residue from the substrate, wherein the cleaning composition comprises a composition of claim 10.

21. The process for cleaning photoresist or residue from a microelectronic substrate, the process comprising contacting the substrate with a cleaning composition for a time sufficient to clean the photoresist or residue from the substrate, wherein the cleaning composition comprises a composition of claim 11.

22. The process for cleaning photoresist or residue from a microelectronic substrate, the process comprising contacting the substrate with a cleaning composition for a time sufficient to clean the photoresist or residue from the substrate, wherein the cleaning composition comprises a composition of claim 12.

23. The process for cleaning photoresist or residue from a microelectronic substrate, the process comprising contacting the substrate with a cleaning composition for a time sufficient to clean the photoresist or residue from the substrate, wherein the cleaning composition comprises a composition of claim 13.

24. The process for cleaning photoresist or residue from a microelectronic substrate, the process comprising contacting the substrate with a cleaning composition for a time sufficient to clean the photoresist or residue from the substrate, wherein the cleaning composition comprises a composition of claim 14.

25. The process for cleaning photoresist or residue from a microelectronic substrate, the process comprising contacting the substrate with a cleaning composition for a time sufficient to clean the photoresist or residue from the substrate, wherein the cleaning composition comprises a composition of claim 15.

26. The process for cleaning photoresist or residue from a microelectronic substrate, the process comprising contacting the substrate with a cleaning composition for a time sufficient to clean the photoresist or residue from the substrate, wherein the cleaning composition comprises a composition of claim 16.

27. The process for cleaning photoresist or residue from a microelectronic substrate, the process comprising contacting the substrate with a cleaning composition for a time sufficient to clean the photoresist or residue from the substrate, wherein the cleaning composition comprises a composition of claim 17.

28. The process for cleaning photoresist or residue from a microelectronic substrate, the process comprising contacting the substrate with a cleaning composition for a time sufficient to clean the photoresist or residue from the substrate, wherein the cleaning composition comprises a composition of claim 18.

29. The process for cleaning photoresist or residue from a microelectronic substrate, the process comprising contacting the substrate with a cleaning composition for a time sufficient to clean the photoresist or residue from the substrate, wherein the cleaning composition comprises a composition of claim 19.

30. A process for cleaning photoresist or residue from a microelectronic substrate, the process comprising contacting the substrate with a cleaning composition for a time sufficient to clean the photoresist or residue from the substrate, wherein the cleaning composition comprises a composition of claim 1.

31. A process for cleaning photoresist or residue from a microelectronic substrate, the process comprising contacting the substrate with a cleaning composition for a time sufficient to clean the photoresist or residue from the substrate, wherein the cleaning composition comprises a composition of claim 2.

32. A process for cleaning photoresist or residue from a microelectronic substrate, the process comprising contacting the substrate with a cleaning composition for a time sufficient to clean the photoresist or residue from the substrate, wherein the cleaning composition comprises a composition of claim 3.

33. A process for cleaning photoresist or residue from a microelectronic substrate, the process comprising contacting the substrate with a cleaning composition for a time sufficient to clean the photoresist or residue from the substrate, wherein the cleaning composition comprises a composition of claim 4.

34. A process for cleaning photoresist or residue from a microelectronic substrate, the process comprising contacting the substrate with a cleaning composition for a time sufficient to clean the photoresist or residue from the substrate, wherein the cleaning composition comprises a composition of claim 5.

35. A process for cleaning photoresist or residue from a microelectronic substrate, the process comprising contacting the substrate with a cleaning composition for a time sufficient to clean the photoresist or residue from the substrate, wherein the cleaning composition comprises a composition of claim 6.

36. A process for cleaning photoresist or residue from a microelectronic substrate, the process comprising contacting the substrate with a cleaning composition for a time sufficient to clean the photoresist or residue from the substrate, wherein the cleaning composition comprises a composition of claim 7.

37. A process for cleaning photoresist or residue from a microelectronic substrate, the process comprising contacting the substrate with a cleaning composition for a time sufficient to clean the photoresist or residue from the substrate, wherein the cleaning composition comprises a composition of claim 8.

38. A process for cleaning photoresist or residue from a microelectronic substrate, the process comprising contacting the substrate with a cleaning composition for a time sufficient to clean the photoresist or residue from the substrate, wherein the cleaning composition comprises a composition of claim 9.

39. A composition stabilized as to the amount of available halogen comprising:

(a) an oxidizer selected from the group consisting of an organic salt of a halogen oxygen acid selected from the group consisting of alkyl chlorites alkyl hypochlorites, tetraalkylammonium chlorites, tetraalkylammonium hypochlorites, substituted tetraalkylammonium chlorites, and substituted tetraalkylammonium hypochlorites; and (b) a stabilizing effective amount of a stabilizer selected from the group consisting of triazoles, thiazoles, tetrazoles and imidazoles in an amount of from about 0.1% to about 5% by weight of the composition and having been incorporated with the organic salt of the halogen oxygen acid during synthesis of the organic salt of the halogen oxygen acid.

40. The composition of claim 39 wherein the stabilizer is a triazole.

41. The composition of claim 40 wherein the stabilizer is benzotriazole.

42. The composition of claim 39 wherein the oxidizer component (a) is selected from the group consisting of alkyl hypochlorites and tetralkylammonium hypochlorites.

43. The composition of claim 39 wherein the oxidizer component (a) is selected from the group consisting of t-butyl hypochlorite and tetramethylammonium hypochlorite.

44. The composition of claim 41 wherein the oxidizer component (a) is selected from the group consisting of t-butyl hypochlorite and tetramethylammonium hypochlorite.

45. A process for cleaning photoresist or residue from a microelectronic substrate, the process comprising contacting the substrate with a cleaning composition for a time sufficient to clean the photoresist or residue from the substrate, wherein the cleaning composition comprises a composition of claim 39.

46. A process for cleaning photoresist or residue from a microelectronic substrate, the process comprising contacting the substrate with a cleaning composition for a time sufficient to clean the photoresist or residue from the substrate, wherein the cleaning composition comprises a composition of claim 40.

47. A process for cleaning photoresist or residue from a microelectronic substrate, the process comprising contacting the substrate with a cleaning composition for a time sufficient to clean the photoresist or residue from the substrate, wherein the cleaning composition comprises a composition of claim 41.

48. process for cleaning photoresist or residue from a microelectronic substrate, the process comprising contacting the substrate with a cleaning composition for a time sufficient to clean the photoresist or residue from the substrate, wherein the cleaning composition comprises a composition of claim 42.

49. A process for cleaning photoresist or residue from a microelectronic substrate, the process comprising contacting the substrate with a cleaning composition for a time sufficient to clean the photoresist or residue from the substrate, wherein the cleaning composition comprises a composition of claim 43.

50. A process for cleaning photoresist or residue from a microelectronic substrate, the process comprising contacting the substrate with a cleaning composition for a time sufficient to clean the photoresist or residue from the substrate, wherein the cleaning composition comprises a composition of claim 44.

51. A process according to claim 30 wherein the composition comprises an organic salt of a halogen oxy acid in an amount, based on the total weight of the composition, of from about 0.001% to about 30% and provides from about 0.001% to about 30% available halogen.

52. A process according to claim 51 wherein the composition comprises benzotriazole as component (c).

53. A process according to claim 51 wherein-the stabilizer (c) is present in an amount up to about 0.5% by weight.

54. A process according to claim 53 wherein the composition comprises benzotriazole as component (c).

55. A process according to any one of claims 30, 31 or 32-54 wherein the microelectronic substrate being cleaned is characterized by the presence of at least one of a copper, tantalum, tungsten, nickel, gold, cobalt, palladium, platinum, chromium, ruthenium, rhodium, iridium, hafnium, titanium, molybdenum, and tin metallization, and sensitive low-κ or high-κ dielectrics.

* * * * *

UNITED STATES PATENT AND TRADEMARK OFFICE
CERTIFICATE OF CORRECTION

PATENT NO. : 7,521,406 B2
APPLICATION NO. : 10/982330
DATED : April 21, 2009
INVENTOR(S) : Chien-Pin Sherman Hsu It is certified that error appears in the above-identified patent and that said Letters Patent is hereby corrected as shown below:

Column 11, line 58, "hydrogen" should read --halogen--.
Column 12, line 38, "hydrogen" should read --halogen--.
Column 16, lines 33-34, "or 32-54" should read --32-38 or 45-54--.

Signed and Sealed this

Eighteenth Day of August, 2009

David J. Kappos
*Director of the United States Patent and Trademark Office*